United States Patent
Peters et al.

(10) Patent No.: US 6,803,763 B2
(45) Date of Patent: Oct. 12, 2004

(54) METHOD AND SYSTEM FOR RETROSPECTIVE PHASE CORRECTION FOR FAST SPIN ECHO MAGNETIC RESONANCE IMAGING

(75) Inventors: Robert D. Peters, Sussex, WI (US); R. Scott Hinks, Waukesha, WI (US)

(73) Assignee: GE Medicalsystems Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/248,357
(22) Filed: Jan. 13, 2003

(65) Prior Publication Data
US 2004/0135578 A1 Jul. 15, 2004

(51) Int. Cl.[7] ............................................. G01V 3/00
(52) U.S. Cl. ................................. 324/319; 324/318
(58) Field of Search ..................................... 324/319, 318, 324/321, 309, 307, 312, 314, 300; 600/410, 412, 459

(56) References Cited

U.S. PATENT DOCUMENTS

| 5,378,985 | A | * | 1/1995 | Hinks | 324/309 |
| 5,818,229 | A | * | 10/1998 | Kanazawa | 324/309 |
| 6,160,397 | A | * | 12/2000 | Washburn et al. | 324/309 |
| 6,369,568 | B1 | | 4/2002 | Ma | 324/309 |

FOREIGN PATENT DOCUMENTS

| EP | 0818 | * | 1/1998 |
| EP | 0 845 684 A1 | * | 6/1998 |

* cited by examiner

Primary Examiner—Brij B. Shrivastav
(74) Attorney, Agent, or Firm—Artz & Artz, PC

(57) ABSTRACT

A phase correction method for MR devices includes collecting non-phase encoded reference data, calculating phase coefficients, and then phase correcting the regular phase-encoded image dataset based on these coefficients. The phase correction method can be used for two dimensional or three dimensional FSE imaging and variants thereof. As the method is conducted after signal acquisition, it is considered a retrospective phase correction.

9 Claims, 2 Drawing Sheets

METHOD AND SYSTEM FOR RETROSPECTIVE PHASE CORRECTION FOR FAST SPIN ECHO MAGNETIC RESONANCE IMAGING

BACKGROUND OF INVENTION

The present invention relates generally to Magnetic Resonance Imaging (MRI) systems, and more particularly, to a method and system for improving image quality through phase correction.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a superconducting magnet capable of generating a strong, homogenous magnetic field around a patient or portion of the patient; a radio-frequency (RF) transmitter and receiver system, including transmitter and receiver coils, also surrounding or impinging upon a portion of the patient; a magnetic gradient coil system also surrounding a portion of the patient; and a computer processing/imaging system, receiving the signals from the receiver coil and processing the signals into interpretable data, such as visual images.

The superconducting magnet is used in conjunction with a magnetic gradient coil assembly, which is temporally pulsed to generate a sequence of controlled gradients in the main magnetic field during a MRI data gathering sequence.

Fast spin echo (FSE) is one of the most widely used clinical MR imaging techniques for its ability to acquire T1, T2, or proton density weighted images in a relatively short period of time. Unfortunately, FSE is prone to ghosting artifacts.

The disadvantages associated with current MR systems have made it apparent that a new technique for phase correction is needed. The new technique should reduce ghosting in FSE images that result from loss of phase coherence. The present invention is directed to this end.

SUMMARY OF THE INVENTION

In accordance with one aspect of the present invention, a phase correction method for MR devices includes first acquiring a limited set of non-phase encoded echoes from which zeroth-order and first-order phase coefficients are derived. The reference data consist of a non-phase encoded FSE echo train that is acquired before and/or after the acquisition of the regular phase-encoded image data. The invention then includes applying a phase correction, using the zeroth-order and first-order phase coefficients, to the regular phase-encoded image data.

One advantage of the present invention is a reduction in FSE image ghosting and, consequently, an overall improvement in FSE image quality. Further, an improvement in the FSE image quality can lead to a more accurate clinical diagnosis, fewer repeat scans, and an increased patient throughput.

As the present invention serves to restore coherence along the echo train, another advantage is an increase in the maximum recommended echo train length. With the FSE imaging technique, an increase in the echo train length can translate into a proportionate decrease in imaging time. As a result, the present invention may serve to reduce the time required to produce an image.

Finally, FSE ghosting is known to be very sensitive to the location of off-isocenter field-of-views. As the present invention serves to reduce ghosting in FSE images, an additional advantage is a reduction in the sensitivity of isocenter positioning and consequently, a reduction in the patient setup time for certain MR examinations.

The present invention itself, together with attendant advantages, will be best understood by reference to the following detailed description, taken in conjunction with the accompanying FIGURES.

BRIEF DESCRIPTION OF DRAWINGS

For a more complete understanding of this invention reference should now be made to the embodiments illustrated in greater detail in the accompanying FIGURES and described below by way of examples of the invention wherein.

DETAILED DESCRIPTION

While the present invention is described with respect to a method for phase correction in MR systems, the present invention may be adapted to phase correction within various systems including: cylindrical and various other magnetic field geometries as well as various RF coils.

In the following description, various operating parameters and components are described for one embodiment. These specific parameters and components are included as examples and are not meant to be limiting.

Figure 1:
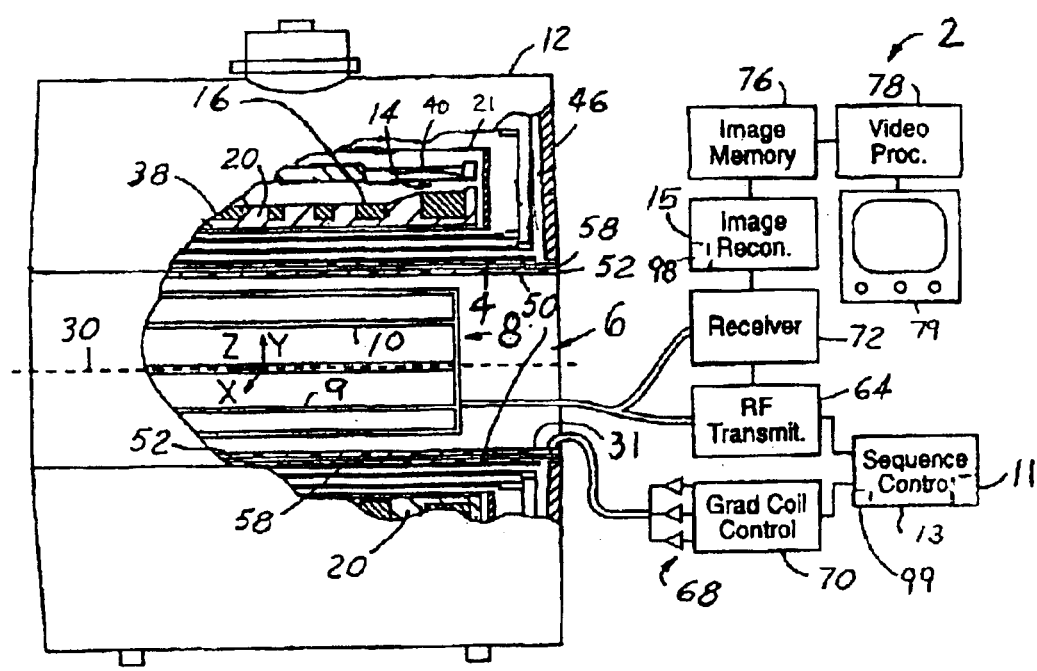
FIG. 1 is a block diagrammatic view of a MRI system in accordance with one embodiment of the present invention.

Referring to FIG. 1, a block diagrammatic view of a MRI system 2 is illustrated. The MR system 2 includes a substantially cylindrical member 4 that defines a scanning bore 6. The scanning bore 6 includes a coil assembly 8 including a coil 9 mounted therein. Operation of the coil 9 is controlled through a scan controller 11 and a phase correction reference data acquisition controller 99 (both of which are included in the sequence control 13). These will be discussed in detail later.

The MR system 2 further includes a toroidal vacuum vessel 46 that includes the cylindrical member 4 that defines the scanning bore 6 and extends parallel to the longitudinal axis at the center 30 thereof. On a first exterior side 50 of the cylindrical member 4, which is the longitudinal side farthest away from the center 30 of the scanning bore 6, is a magnetic gradient coil assembly 52. A radio-frequency (RF) shield 58 is applied to the magnetic gradient coil assembly 52.

The coil assembly 52, mounted in the scanning bore 6, includes a coil 31. The coil assembly 52 receives the scan signal and generates an image signal in response to the scan and a reference signal used for phase correction.

The MR system 2 further includes a static magnet structure 12 including a superconducting magnet 14 having a plurality of superconducting magnetic field coils 16 which generate a temporally constant magnetic field along a longitudinal z-axis of the scanning bore 6. The superconducting magnet coils 16 are supported by a superconducting magnet coil support structure 20.

A RF transmitter 64 is connected to the sequence controller 13 and the coil 31. The sequence controller 13 controls a series of current pulse generators 68 via a gradient coil controller 70 that is connected to the magnetic gradient coil assembly 52. The RF transmitter 64, in conjunction with the sequence controller 13, generates pulses of radio-frequency signals for exciting and manipulating magnetic resonance through the static magnet structure 12 and in selected dipoles of a portion of the subject within the scanning bore 6. Signals are generated therefrom that are later arranged to generate an image signal or regular phase-encoded image data as well as non-phase encoded phase correction reference data, as will be understood by one skilled in the art.

The first step of the embodied correction method is the collection of a limited set of non-phase encoded reference echoes from which the zeroth-order and first-order phase coefficients will be computed. Acquisition of this reference data within the phase correction algorithm 11 requires turning off phase-encoding and zeroing the receive phase offsets (for off-center FOVs). An echo-train-length (ETL) number of echoes can be acquired before and/or after the acquisition of the regular phase-encoded image data, so indicated as the BEFORE and AFTER reference data.

BEFORE reference data is acquired at the very beginning of the regular image sequence, after usual prescan calibrations have been completed. If discarded data acquisitions (DDAs) are used, the last DDA can be used for this purpose at no additional time penalty.

AFTER reference data is acquired in the phase correction algorithm 11 at the very end of the regular image acquisition and will require additional imaging time equal to the product of the repetition time of the sequence and the number of acquisitions.

Using reference datasets acquired BEFORE and AFTER can improve accuracy over using either only the BEFORE or AFTER set and will serve to average out any potential temporal drift in phase stability of the MR system 2.

The second step of the present method is that Zeroth-order and first-order coefficients (otherwise known as constant and linear coefficients) are determined from each of the reference datasets on an echo-by-echo basis. Calculation of the phase coefficients first involves performing a one dimensional Fourier transform to the reference echoes and then fitting a straight line to the phase difference profiles, obtained by subtracting the phase profile of the first echo from the remaining echoes in the reference dataset(s). The nth phase difference profile will be determined using the following equation:

$$\Delta \Phi_n = \arctan\left\{\frac{\text{Re}_l(x)\text{Im}_n(x) - \text{Re}_n(x)\text{Im}_l(x)}{\text{Re}_n(x)\text{Im}_l(x) + \text{Re}_n(x)\text{Im}_l(x)}\right\}$$

Re and Im refer to the real and imaginary components of the profile along the frequency encoding direction, x. The linear fit, which yields the Zeroth-order and first-order coefficients is performed through one of three methods.

The first method is termed Ahn/Cho, where the fit of the phase-difference profile is performed using the method as described in the literature by Ahn and Cho. This method generally results in a more robust linear fit and is insensitive to phase wraparound errors.

The second method is a Least Squares method of fitting the phase-difference profile, which though prone to phase wrap around errors, appears better suited to handling low SNR data.

The third method is the Ahn/Cho followed by Least Squares method. This method combines the above two methods. The Ahn/Cho method is first used to estimate the coefficients and the phase-difference profile is corrected by these zeroth-order and first-order coefficients. Subsequently, the Least Squares fitting routine is applied to the residual profile to update the zeroth-order and first-order coefficients.

Following the aforementioned calculation, in the event that both reference datasets are acquired (i.e. BEFORE and AFTER), the individual zeroth-order and first-order coefficients are be averaged.

Once the zeroth-order and first-order coefficients are determined for each echo within the echo train, a phase correction is applied to the entire regular (phase-encoded) image set on an echo-by-echo basis. This is performed with knowledge of a look-up table that relates each phase-encoded echo with its location in the echo train. Given the coefficients, there are three possible ways of phase correcting the regular image data: zeroth-order and first-order, in which both sets of coefficients are used; zeroth-order only, in which only the constant or phase intercepts are used; and first-order only, in which only the linear or phase slopes are used.

Following the aforementioned phase correction, a one dimensional Fourier Transform is applied along the phase-encode direction to yield an image.

Handling of multiple channel/coil data is an additional parameter in the Retrospective Phase Correction technique. Three ways through which the above phase correction can handle multi-coil data are termed: All Coils, Coil with the Largest Signal, and Coil with Largest Signal Applied to All.

For the All Coils method, phase correction coefficients are calculated from each coil, and correction is applied to each coil independently. This is a primary option for single-channel coils.

For the Coil with Largest Signal method, only the coil with the largest amount of signal undergoes a phase correction with its coefficients. All remaining coils do not get phase corrected.

For the Coil with Largest Signal Applied to All method, the phase coefficients determined from the coil with the largest signal are applied to the data from all coils. Consequently, all coils receive a phase correction.

As a final step, a combined image signal is constructed by taking the square root of the sum of the squares of the individual coil-derived images.

The phase correction algorithm 98 receives the phase-encoded regular image signals and the non-phase encoded phase correction signals from the phase correction reference data acquisition controller 99. This occurs through a radio-frequency receiver 72, connected with the coil 31, for demodulating magnetic resonance signals emanating from an examined portion of a subject. The image reconstruction apparatus (image reconstructor 15 and phase correction algorithm 98) reconstructs the received magnetic resonance signals into an electronic image representation that is stored in an image memory 76. An image reconstruction device, such as a video processor 78 converts stored electronic images into an appropriate format for display on a video monitor 79.

Figure 2:
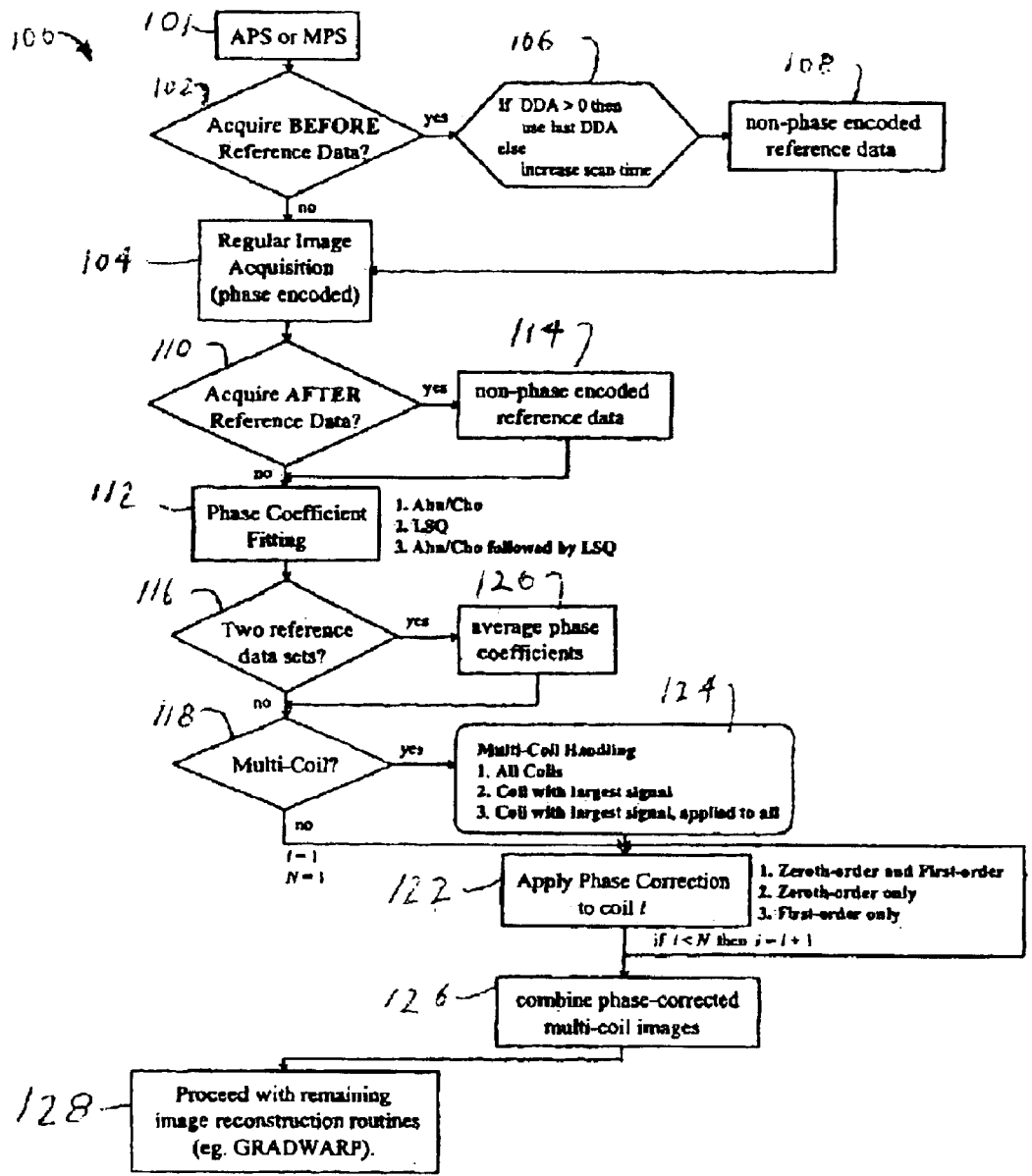
FIG. 2 is a logic flow diagram of a method for phase correction in accordance with another embodiment of the present invention.

Referring to FIG. 2, a method for phase correction 100 is illustrated. Logic starts in operation block 101 where prescan calibrations, auto pre-scan (APS) or manual pre-scan (MPS), is engaged by a user.

In inquiry block 102, a determination is made as to whether the user has requested to acquire the BEFORE reference data. A negative response flows to operation block 104, where regular image acquisition cycles.

Otherwise, in operation block 106, if discarded data acquisitions (DDA) are predetermined greater than zero, then the method uses the last discarded data acquisition.

Otherwise, scanning time is increased by including one DDA. In operation block 108 the non-phase encoded reference data is acquired and flow is sent to operation block 104.

In inquiry block 110, a check is made as to whether the user has requested acquisition of AFTER reference data. A negative response flows to operation block 112, where the phase coefficients are fitted using: Ahn/Cho, LSQ, or Ahn/Cho followed by LSQ.

Otherwise, in operation block 114, non-phase encoded reference data is acquired and flow is sent to operation block 112. In inquiry block 116, a check is made as to whether two reference datasets (BEFORE and/or AFTER) have been acquired. For negative response, flow proceeds to in inquiry block 118, where multicoil handling begins.

Otherwise, in operation block 120, the phase coefficients are averaged together from the two reference datasets and flow continues to inquiry block 118.

At inquire block 118, a check is made as to whether the imaging system uses a single coil or a multi coil. For negative response in operation block 122, phase correction is applied to the single coil.

Otherwise, in operation block 124, multi-coil handling is engaged. This will include phase correction for All Coils, the Coil with the Largest Signal, or the Coil with the Largest Signal Applied to All the coils.

Then, in operation block 122, phase correction is applied to each coil. A control loop cycles around block 122 until each phase coil has had phase correction applied thereto. If the phase coil l is less than N, then l=l+1. Optional phase correction methods include Zeroth-order and First-order, Zeroth-order only or First-order only.

In operation block 126, the phase corrected multi-coil images are combined. In operation block 128, normal image reconstruction routines cycle through, as will be understood by one skilled in the art.

The above-described steps are meant to be an illustrative example. The steps may be performed synchronously or in a different order depending upon the application.

The phase correction method for MR devices includes collecting non-phase encoded reference data, calculating phase coefficients, and then phase correcting the regular phase-encoded image dataset based on these coefficients. The phase correction method can be used for 2 dimensional or 3 dimensional FSE imaging and variants thereof. As the method is conducted after signal acquisition, it is considered a retrospective phase correction.

The above-described apparatus, to one skilled in the art, is capable of being adapted for various purposes and is not limited to the following systems: MRI systems, magnetic resonance spectroscopy systems, and other applications where field instability is an issue in the design of system components. The above-described invention may also be varied without deviating from the spirit and scope of the invention as contemplated by the following claims.

What is claimed is:

1. A phase correction method for an MR device comprising: initializing existing MR receive phase offsets; acquiring, before acquisition of regular phase encoded image data, a before non-phase encoded reference dataset comprising a plurality of echoes; calculating phase coefficients through fitting a first set of zeroth-order and first-order phase coefficients from said before non-phase encoded reference dataset as a function of a fitting algorithm; applying a phase correction to a phase encoded image data set on an echo-by-echo basis as a function of said first set of zeroth-order and first-order phase coefficients; and correcting said regular phase encoded image data through at least one of Zeroth-order and First-order, Zeroth-order only, or First-order only.

2. A method as in claim 1 further comprising acquiring an AFTER non-phase encoded reference dataset.

3. A method as in claim 2 further comprising generating a second set of zeroth-order and first-order phase coefficients from said AFTER reference data; and averaging said first phase coefficients with second phase coefficients.

4. A method as in claim 1 wherein fitting a phase coefficient comprises at least one of Ahn/Cho, LSQ, or Ahn/Cho followed by LSQ.

5. A method as in claim 1 further comprising handling a phase correction in a plurality of coils at least one of: calculating a phase correction coefficient for each of a plurality of coils and correcting each of said plurality of coils independently in response to a respective phase correction coefficient from each coil of said plurality of coils, or calculating a phase correction coefficient from a coil having a largest signal and correcting said coil with said largest signal in response to said phase correction coefficient from said coil having said largest signal, or calculating said phase correction coefficient from said coil having said largest signal and applying it to each of said plurality of coils.

6. A method as in claim 1 further comprising combining phase-corrected multi-coil images.

7. An MR system comprising:
a coil assembly comprising a coil, said coil assembly adapted to receive a scan signal, said coil assembly further adapted to generate an image signal in response to said scan signal and a phase correction reference data signal; an image reconstructor adapted to receive said image signal, said image reconstructor including a phase correction algorithm adapted to perform phase correction on said image signal, a phase correction reference data acquisition controller adapted to: acquire before reference dataset, comprising a number of echoes, before acquisition by the MR system of regular phase encoded image data and calculate phase correction coefficients by fitting zeroth-order and first-order phase coefficients from said before reference dataset, said data acquisition controller further adapted to apply said phase correction coefficients to said coil through correcting said regular phase encoded image data through at least one of Zeroth-order and First-order, Zeroth order only, or First-order only; and a scan controller adapt to generate said scan signal.

8. The system of claim 7 wherein said phase correction controller is adapted to generate said phase correction coefficients through logic adapted to fit said phase coefficients including at least one of Ahn/Cho, LSQ, or Ahn/Cho followed by LSQ.

9. The system of claim 8 wherein said phase correction controller is adapted to generate said phase correction signal through logic adapted to handle a phase correction in a plurality of coils including at least one of: calculating a phase correction coefficient for each of a plurality of coils and correcting each of said plurality of coils independently in response to a respective phase correction coefficient from each coil of said plurality of coils, or calculating a phase correction coefficient from a coil having a largest signal and correcting said coil with said largest signal in response to said phase correction coefficient from said coil having said largest signal, or calculating said phase correction coefficient from said coil having said largest signal and applying it to each of said plurality of coils.

* * * * *